United States Patent [19]
Takahashi

[11] Patent Number: 5,530,654
[45] Date of Patent: Jun. 25, 1996

[54] LSI LOGIC SYNTHESIS DEVICE AND METHOD THEREFOR

[75] Inventor: Etsuo Takahashi, Tokyo, Japan

[73] Assignee: NEC Corporation, Tokyo, Japan

[21] Appl. No.: 269,102

[22] Filed: Jun. 30, 1994

[30] Foreign Application Priority Data

Jun. 30, 1993 [JP] Japan ................................ 5-160575

[51] Int. Cl.⁶ ................................................ G06F 17/50
[52] U.S. Cl. ............................................ 364/488; 364/488
[58] Field of Search .......................... 364/488, 489, 364/490; 395/500

[56] References Cited

U.S. PATENT DOCUMENTS

| | | | |
|---|---|---|---|
| 4,703,435 | 10/1987 | Darringer et al. | 364/489 |
| 4,882,690 | 11/1989 | Shinsha et al. | 364/490 |
| 5,003,487 | 3/1991 | Drumm et al. | 364/489 |
| 5,029,102 | 7/1991 | Drumm et al. | 364/489 |
| 5,276,855 | 1/1994 | Kitahara | 395/500 |
| 5,287,289 | 2/1994 | Kageyama et al. | 364/489 |
| 5,331,569 | 7/1994 | Iijima | 364/489 |
| 5,359,537 | 10/1994 | Saucier et al. | 364/489 |

*Primary Examiner*—Vincent N. Trans
*Attorney, Agent, or Firm*—Foley & Lardner

[57] ABSTRACT

Logic synthesis device for LSI having a configuration divided into a plurality of hierarchical blocks specified by hierarchical design comprises a logic synthesis section which uses the logic description information describing the logic operation contents for each of the hierarchical blocks, information about location and area of the hierarchical blocks constituting the LSI and correspondence information between the logic operation contents described in the logic description information and the logic gate circuits physically described on LSI in order to make logic synthesis in and between hierarchical blocks and to adjust the delay times between the hierarchical blocks based on the block placement information.

14 Claims, 5 Drawing Sheets

EXAMPLE OF WIRING DELAY COMPENSATION

FIG.5

EXAMPLE OF WIRING DELAY ADJUSTMENT WITH FAN OUTS

FIG.6

EXAMPLE OF MINIMUM DELAY COMPENSATION

F9~F12 FLIP-FLOP
D1,D2 DELAY GATES

FIG.7

| (1) NAND NORMAL GATE | (2) NAND POWER GATE |
|---|---|
|  |  |
| FANIN    H01    1(mA) <br>          H02    1(mA) | FANIN    H01    1.4(mA) <br>          H02    1.4(mA) |
| FANOUT    5(mA) | FANOUT    9(mA) |
| GATE DELAY VALUE    A→Y 0.8(ns) <br>                      B→Y 0.8(ns) | GATE DELAY VALUE    A→Y 0.2(ns) <br>                      B→Y 0.2(ns) |
| NUMBER OF CELLS    2 | NUMBER OF CELLS    4 |

## LSI LOGIC SYNTHESIS DEVICE AND METHOD THEREFOR

BACKGROUNDS OF THE INVENTION

1. Field of the Invention

The present invention relates to a logic synthesis device for LSI circuit using CAD technology and a logic synthesis method therefor, and particularly relates to a logic synthesis device for LSI circuit with hierarchical design and a logic synthesis method therefor.

2. Description of the Related Art

With recent advance in integration technology, LSI circuits have been becoming larger and more complicated, which results in complicated design work for logic circuits. Under such circumstances, hierarchical designing has been adopted to facilitate the design of complicated configuration in LSI circuit. In this designing method, an LSI circuit is treated as modules and divided into a plurality of blocks or a plurality of functional blocks for designing purpose. Besides, CAD (Computer Aided Design) technology is used for logic synthesis of LSI circuit. Various logic synthesis devices for logic synthesis have been proposed.

Examples of such logic synthesis device for LSI circuit with hierarchical design include a logic synthesis device which makes logic synthesis of the entire LSI at a time without any block division of LSI and a logic synthesis device which divides an LSI into blocks and makes logic synthesis inside each of the blocks, which are disclosed in Japanese Patent Application Laid-open No. 84676/1991 and No. 116281/1991 respectively. However, these patents do not disclose any logic synthesis method for the blocks constituting the LSI.

In the logic synthesis program used in such conventional logic synthesis devices, the wire length between blocks constituting the LSI cannot be automatically estimated. The LSI circuit designer must input all data related to the wires between the blocks to the logic synthesis program or insert some data for the wires of the part with severe requirements from the viewpoint of circuit operation alone and provide them to the logic synthesis program for logic synthesis between the blocks.

In an LSI with hierarchical design, however, many wires over blocks constituting the LSI are often complicatedly routed and, if the data related to wiring between the blocks are manually input to the logic synthesis program, omission or error in wire specification and critical paths easily occur. It is necessary to repeat logic synthesis until all omissions and errors in wire specification and critical paths are cleaned. Thus, logic synthesis with conventional logic synthesis device as above requires many operators and many manhours as well as long designing period.

SUMMARY OF THE INVENTION

It is an object of the present invention to provide a logic synthesis device and logic synthesis method which reduces manhours required in logic synthesis for a shorter designing period by automatically estimating the wire length between the blocks with input of locations and area on LSI of the blocks constituting the LSI.

It is another object of the present invention to provide a logic synthesis device and logic synthesis method to assure prevention of omission or error in wire specification and critical path occurrence caused by manual provision of wiring information by means of automatic estimation of the wire length between the blocks constituting the LSI.

According to a preferred embodiment of the present invention to attain the above objects, a logic synthesis device for LSI comprises a logic description information file which stores, for the LSI having a configuration with a plurality of hierarchical blocks given through hierarchical design, logic description information in a certain design description language describing the logic operation contents of the LSI for each of the hierarchical blocks, a block placement information file which stores information about location and area on LSI of the hierarchical blocks constituting the LSI, a library which stores the correspondence information between the logic operation contents described in the logic description information and the logic gate circuits physically realized on the LSI, and logic synthesis means which makes logic synthesis in the hierarchical block and between the hierarchical blocks based on the logic description information and the correspondence information and adjusts the delay time between the hierarchical blocks based on the block placement information.

According to a further preferred embodiment of the present invention, the logic synthesis means further comprises means to make the logic synthesis using the block placement information and the correspondence information for each of the hierarchical blocks and delay adjustment means to adjust the delay time between the hierarchical blocks with considering the distance between the hierarchical blocks obtained from the block placement information so that the delay time between the hierarchical blocks satisfies the delay time predetermined as conditions.

According to a still preferred embodiment of the present invention, the logic synthesis means further comprises judgment means to judge whether the delay time between the blocks as a result of the delay time adjustment satisfies the delay time predetermined as conditions.

According to another preferred embodiment of the present invention, the delay adjustment means of the logic synthesis means changes, deletes or adds logic gate circuit(s) of the hierarchical block where the logic synthesis is executed so that the delay time between the hierarchical blocks satisfies the predetermined delay time.

According to still another preferred embodiment, the logic synthesis means further comprises means to make the logic synthesis using the block placement information and the correspondence information for each of the hierarchical blocks and judgment means to judge whether the hierarchical block where the logic synthesis is made can be settled within the area specified in the block placement information.

According to a further preferred embodiment, the LSI block placement information file stores, as the information about location and area on LSI of the hierarchical blocks constituting the LSI, values on two-dimensional coordinate with two reference axes intersecting at right angles to show the location on LSI of the vertexes of the quadrilateral, which is the shape of the individual hierarchical block.

According to another preferred embodiment of the present invention to attain the above objects, a logic synthesis device for LSI comprises a logic description information file which stores, for the LSI having a configuration with a plurality of hierarchical blocks given through hierarchical design, logic description information in a certain design description language describing the logic operation contents of the LSI for each of the hierarchical blocks, a block placement information file which stores information about location and area on LSI of the hierarchical blocks constituting the LSI, a library which stores the correspondence information between the logic operation contents described in the logic description information and the logic gate circuits physically realized on the LSI, and logic synthesis means which make logic synthesis in the hierarchical block and between the hierarchical blocks based on the logic description information and the correspondence information and adjusts the delay time between the hierarchical blocks based on the block placement information, and the logic synthesis means further comprises means to make the logic synthesis based on the block placement information and the correspondence information for each of the hierarchical blocks, judgment means to judge whether the hierarchical block where the logic synthesis is made can be settled within the area specified in the block placement information and delay adjustment means to adjust the delay time between the hierarchical blocks with considering the distance between the hierarchical blocks obtained from the block placement information.

According to a further preferred embodiment, the delay adjustment means of the logic synthesis means changes, deletes or adds logic gate circuit(s) of the hierarchical block where the logic synthesis is executed so that the delay time between the hierarchical blocks satisfies the predetermined delay time.

According to a still preferred embodiment, the logic synthesis means further comprises judgment means to judge whether the delay time between the blocks as a result of the delay time adjustment satisfies the delay time predetermined as conditions.

According to a further preferred embodiment, the LSI block placement information file stores, as the information about location and area on LSI of the hierarchical blocks constituting the LSI, values on two-dimensional coordinate with two reference axes intersecting at right angles to show the location on LSI of the vertexes of the quadrilateral, which is the shape of the individual hierarchical block.

According to a preferred embodiment of the present invention to attain the above objects, a logic synthesis method for LSI is characterized by the use of, for the LSI having a configuration divided into a plurality of hierarchical blocks specified by hierarchical design, the logic description information in a certain design description language describing the logic operation contents of the LSI for each of the hierarchical blocks, the block placement information about location and area on LSI of the hierarchical blocks constituting the LSI and correspondence information between logic operation contents described in the logic description information and the logic gate circuits physically realized on the LSI, and comprises a logic synthesis step to make logic synthesis in the hierarchical block and between the hierarchical blocks for each of the hierarchical blocks based on the logic description information and the correspondence information and an adjustment step to make adjustment so that the delay time between the hierarchical blocks satisfies the delay time predetermined as conditions with considering the distance between the hierarchical blocks obtained from the block placement information.

According to a further preferred embodiment, a logic synthesis method for LSI further comprises a step to judge whether the hierarchical block where the logic synthesis is executed can be settled within the area specified in the block placement information.

According to a still preferred embodiment, the delay time adjustment step changes, deletes or adds logic gate circuit(s) for the hierarchical block where the logic synthesis is executed so that the delay time between the hierarchical blocks satisfies the delay time predetermined as conditions.

According to still another embodiment of the present invention, a logic synthesis method for LSI further comprises a step to judge whether the delay time between the blocks as a result of the delay time adjustment satisfies the delay time predetermined as conditions.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

Figure 1:
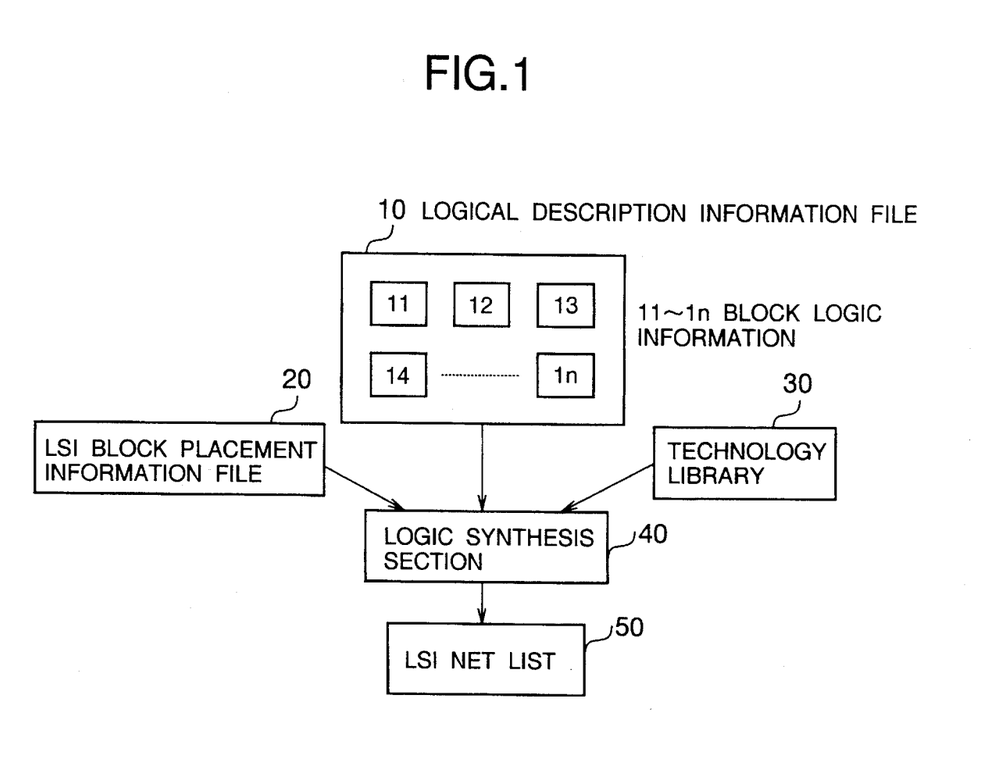
FIG. 1 is a block diagram to show the configuration of a logic synthesis device according to an embodiment of the present invention.

Referring to the attached figures, preferred embodiments of the present invention will be described in details below. FIG. 1 is a block diagram to show the configuration of a logic synthesis device according to an embodiment of the present invention. As shown in the figure, a logic synthesis device of the present invention comprises a logic description information file 10 to store logic description information describing the logic operation of an LSI as a plurality of block logic information 11 to in (n is a positive integer) for the blocks constituting the LSI, an LSI block placement information file 20 to store information about location and area on LSI of the blocks constituting the LSI, a technology library 30 to store mapping information for the logic contents generated on the way of logic synthesis and the logic gate circuits physically realized on the actual LSI and a logic synthesis section 40 to use data from the logic description information file 10, the LSI block placement information file 20 and the technology library 30 so as to make logic synthesis in the block and between blocks and output a net list 50 for the LSI.

The logic description information file 10 contains a plurality of block logic information describing the logic operation of a plurality of hierarchical blocks corresponding to the hierarchical configuration of the LSI for each of the hierarchical blocks. Each block logic information has logic description information showing the contents of the logic operation at the corresponding hierarchical block. The logic description information file 10 also stores the logic description information related to the logic operation between hierarchical blocks. Such logic description information is described in a design description language such as VHDL.

The LSI block placement information file 20 stores the information about location and area of the hierarchical blocks on the LSI. Specifically, location data for vertexes of the quadrilateral of each hierarchical block (with four vertexes if it is a rectangle) on the LSI are given as X and Y values on two-dimensional coordinates having two reference axes X and Y intersecting at right angles, for example. By referring to such information, physical relative position and distance between hierarchical blocks on LSI can be known.

The technology library 30 stores the correspondence between the logic contents expressed in an intermediate language (meta-language) generated during logic synthesis by the logic synthesis section 40 and the logic gate circuits to realize the logic contents. Specifically, it stores the information on correspondence between the logic operations such as AND or NOR described in logic information of the blocks and the logic gate circuits to realize the logic on the LSI. The technology library 30 also has a plurality of logic gate circuits corresponding to the logic expressed in a meta-language to enable preparation of more effective LSI net list (final diagram for logic circuit configuration). In other words, provision of a plurality of logic gate circuits for execution of the same logic enables selection of the optimum circuit configuration corresponding to given setting conditions.

The logic synthesis section 40 uses necessary information from the logic description information file 10, the LSI block placement information file 20 and the technology library 30 to output the LSI net list 50, which is a circuit design diagram for execution on the LSI. For logic synthesis, the logic synthesis section 40 firstly simplify the logic contents of the logic information of the blocks described in the logic description information file 10 by expressing the logic contents in intermediate language (meta-language). Then, the logic contents expressed in the intermediate language are converted to the actual logic gate circuits by reference to the technology library 30 (technology mapping) so that the LSI net list 50 is generated.

In this procedure, the logic synthesis section 40 refers to the LSI block placement information file 20 to consider relative positions of the hierarchical blocks in order to select the optimum circuit configuration from a plurality of circuits for execution of logic corresponding to the applicable block logic information stored in the technology library 30.

The logic synthesis section 40 refers to the LSI block placement information file 20 to adjust the delay time between hierarchical blocks. Such adjustment for delay time is described in detail below by showing some specific examples.

Figure 2:
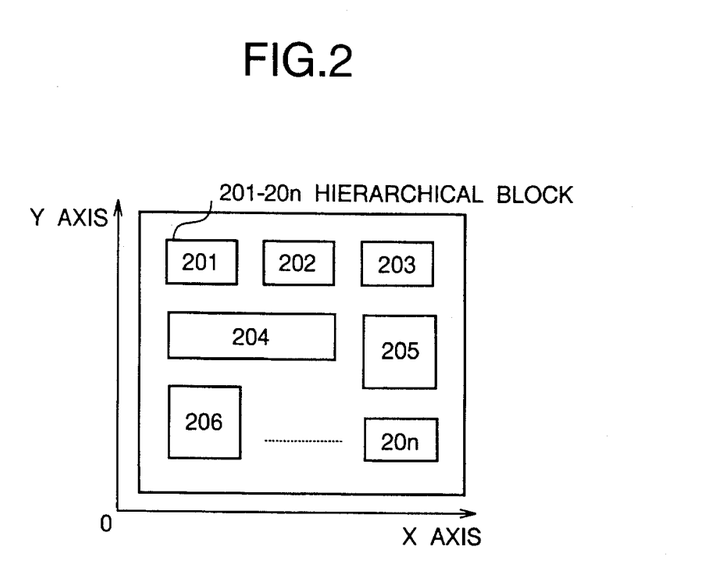
FIG. 2 is a block diagram to show a placement example of the blocks constituting an LSI.

FIG. 2 is a diagram showing an example of positions and sizes of the blocks constituting an LSI on that LSI. In the figure, hierarchical blocks 201 to 20n correspond to the block logic information 11 to 1n in the logic description information file 10 of FIG. 1.

Figure 3:
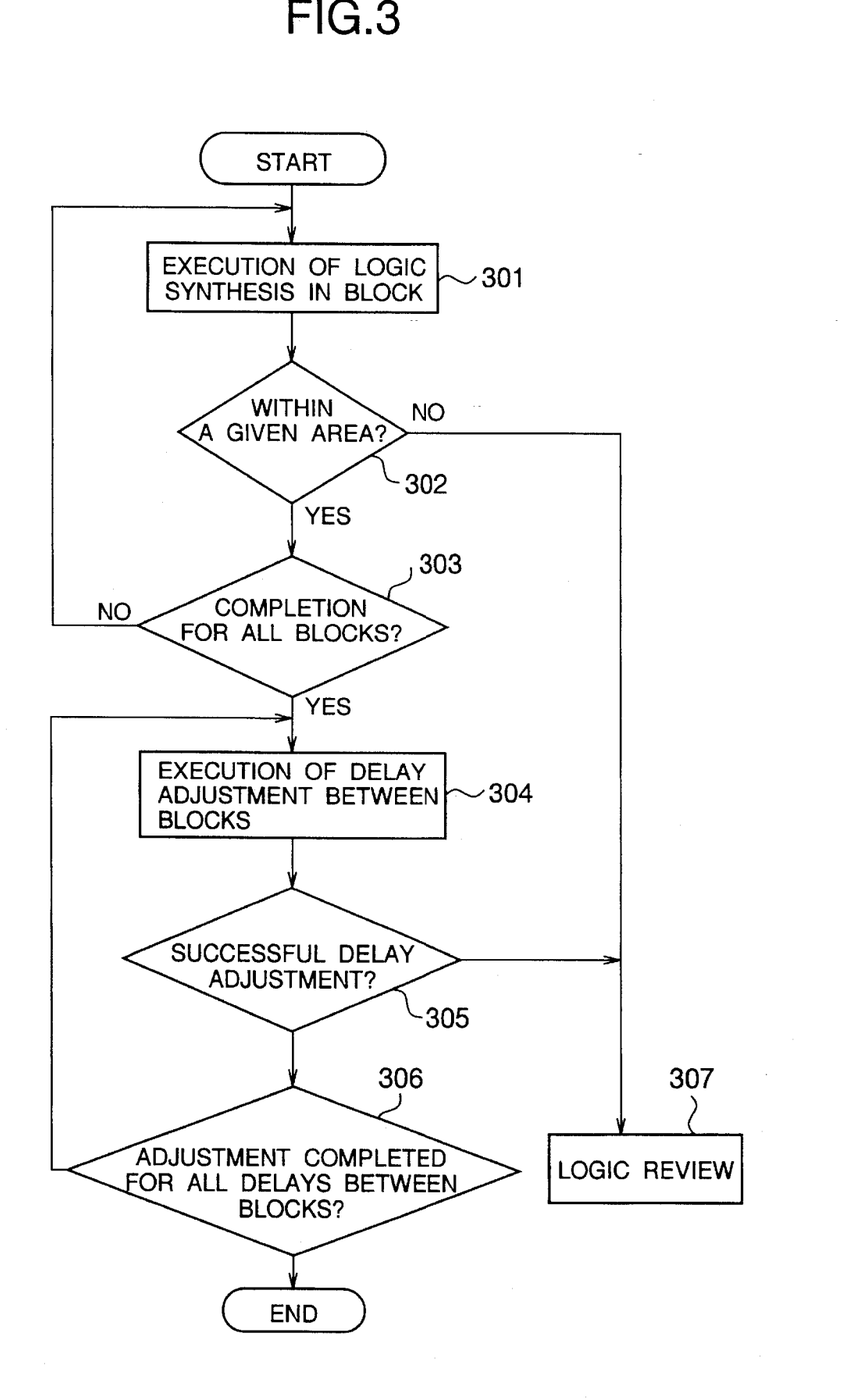
FIG. 3 is a flowchart to illustrate the logic synthesis method using the logic synthesis device according to the present invention.

FIG. 3 is a flowchart to illustrate the logic synthesis operation at the logic synthesis section 40 according to this embodiment. As shown in the figure, the logic synthesis is made for each individual hierarchical block. Logic synthesis is made both in block and between blocks. Upon completion of logic synthesis for each block, delay times between the blocks are adjusted corresponding to the physical wire length between the hierarchical blocks.

First of all, block logic information from the logic description information file 10 is input to each of the hierarchical blocks for execution of logic synthesis in block (Step 301). For the hierarchical blocks where the logic synthesis has been made, the LSI block placement information file 20 is referred to for judgment whether the hierarchical block corresponding to the applicable block logic information can be accommodated within the area given on the LSI (Step 302). When the applicable hierarchical block cannot be settled within the area given on the LSI, the logic in the block is reviewed (Step 307). In other words, the description contents of the block logic information are reviewed. On the other hand, when the applicable hierarchical block can be settled within the area given on the LSI, it is judged whether the same processing is completed or not for all hierarchical blocks (Step 303). Then, upon completion of such processing for all hierarchical blocks, delay times for signal propagation between the hierarchical blocks are adjusted. In this embodiment, the logic synthesis between the hierarchical blocks is made at the same time as the logic synthesis in each hierarchical block.

For adjustment of delay times between the blocks, the logic synthesis section 40 refers to the logic synthesis results for each block as described above and LSI block placement information and considers distance (wire length) between the hierarchical blocks and fan-out at connection of the hierarchical blocks in order to adjust the delay times so that the delay times between the hierarchical blocks satisfy the delay times predetermined as conditions (Step 304).

For such adjustment of delay times, the distance (wire length) between the hierarchical blocks, existence of fan-out at connection of the hierarchical blocks and the logic gate type are considered in determination of the delay time. Logic gates are changed, added or deleted for adjustment so that the determined delay time satisfies the delay time predetermined as conditions. Specific contents of adjustment for hierarchical block delay time are described later. It is judged whether or not delay times are successfully adjusted, i.e. delay times between hierarchical blocks satisfy those predetermined as conditions (Step 305). If the delay time adjustment is not successful, the logic in block and between blocks are reviewed (Step 307).

On the other hand, when the delay time adjustment is successful, it is judged whether the delay adjustment is completed for all hierarchical blocks or not (Step 306). The same processing is repeated until the delay adjustment between the hierarchical blocks are entirely completed. When the delay adjustment is completed for all hierarchical blocks, it is judged that the logic synthesis is successfully made and the processing is terminated.

Figure 4:
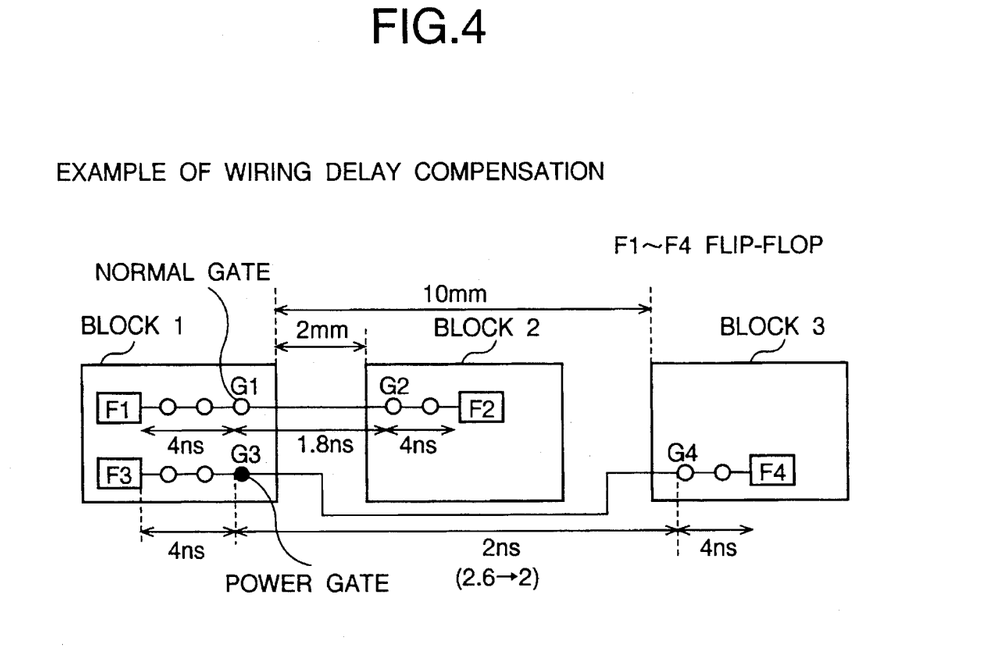
FIG. 4 is a diagram to show an example of adjustment between blocks in the logic synthesis method according to the present invention for wiring delay compensation.
Figure 5:
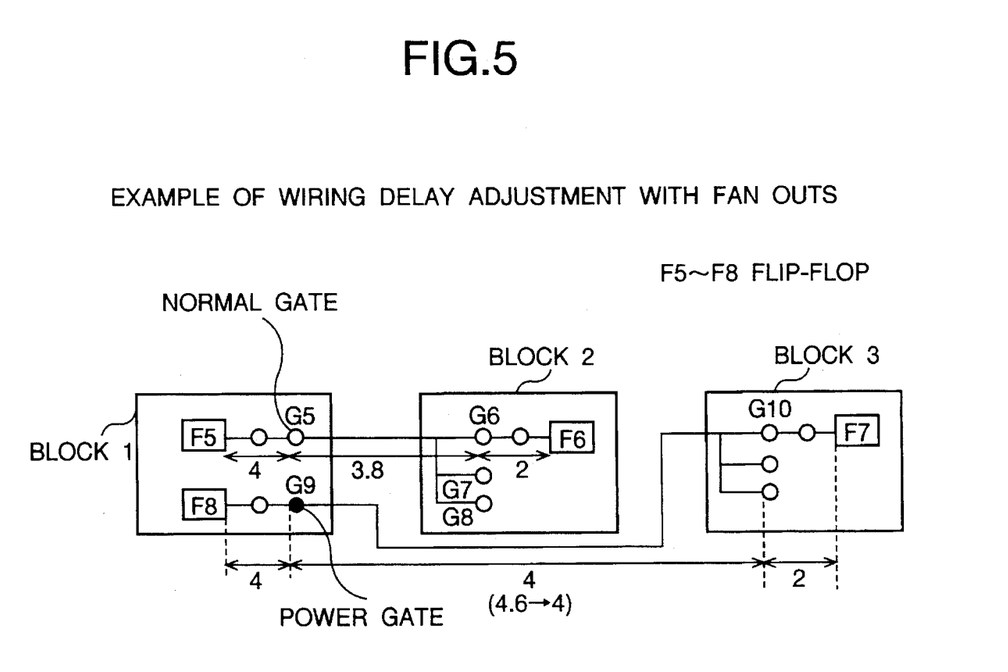
FIG. 5 is a diagram to show an example of adjustment between blocks in the logic synthesis method according to the present invention for fan-out adjustment.
Figure 6:
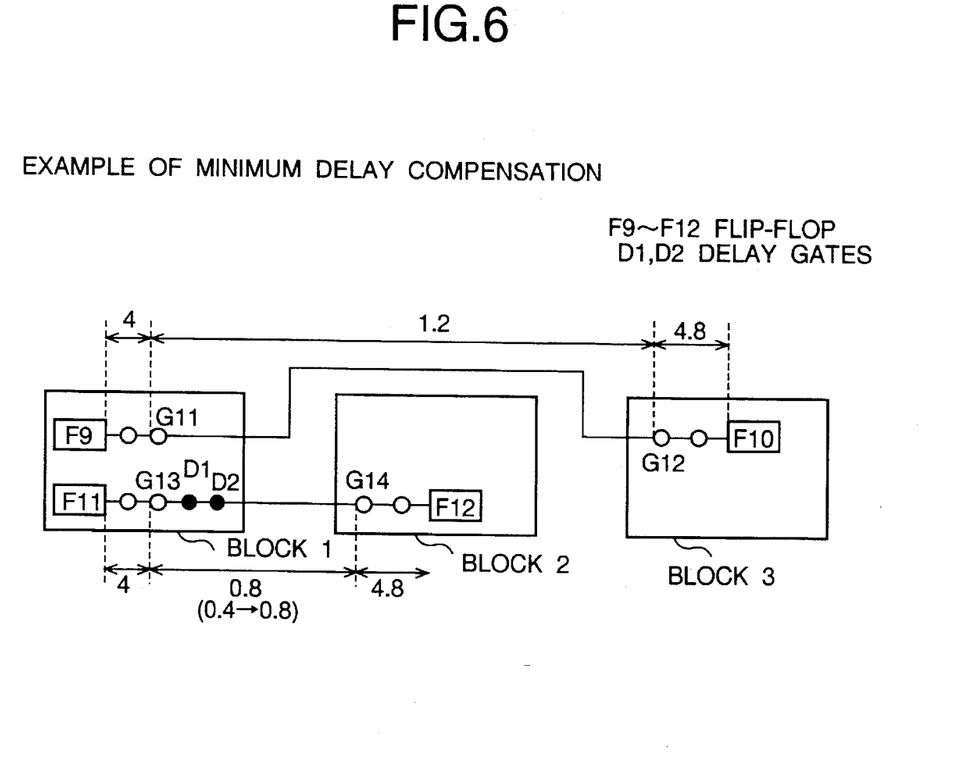
FIG. 6 is a diagram to show an example of adjustment between blocks in the logic synthesis method according to the present invention for minimum delay compensation.

FIGS. 4 to 6 show execution examples of adjustment for delay time between blocks (Step 304) according to this embodiment. Three common conditions for the examples of these figures are:

(A) Distance between hierarchical block 1 and hierarchical block 2 is 2 mm. Distance between hierarchical block 1 and hierarchical block 3 is 10 mm.

(B) Signal is propagated on wire between LSI hierarchical blocks at a rate of 0.1 ns/mm when there is no load at the signal destination. This results in 0.2 ns for 2 mm long wire and 1 ns for 10 mm long wire between the hierarchical blocks.

(C) Signal propagation time between flip-flops must be in the range from 9.6 ns to 10.0 ns.

These conditions may be stored in the logic description information file 10 as the information regarding the logic operation within the block or between the blocks, or may be input by the operator when the logic synthesis section 40 proceeds to the delay time adjustment between the blocks.

Referring now to FIG. 4, an example of wiring delay adjustment will be described below. Firstly, the signal propagation path from flip-flop F1 to flip-flop F2 is described.

Suppose the signal propagation time from flip-flop F1 to gate G1 is 4 ns (including the delay time for two gates and wiring delay time), signal propagation time from gate G1 to gate G2 is 1.8 ns including the wiring delay time between the blocks (1.6 ns (presumption) for gate delay time at gate G1 plus 0.2 ns of (B) above), and the time from gate G2 to flip-flop F2 is 4 ns (same as the time from flip-flop F1 to gate G1). In this case, the signal propagation time from flip-flop F1 to flip-flop F2 is 9.8 ns in total, which satisfies the condition of (C) above. It is not necessary to make adjustment with the logic synthesis section 40.

Then, the signal propagation path from flip-flop F3 to flip-flop F4 is described.

The path from flip-flop F3 to flip-flop F4 is considered to theoretically have the same function as the path from flip-flop F1 to flip-flop F2. However, to adjust the delay time between blocks 1 and 3, a power gate is used for gate G3 on block 1.

A power gate is a gate with the same logic function as a normal gate but with a larger output power. FIG. 5 shows the comparison between the normal gate and the power gate (described in detail later). A power gate has a higher signal driving ability, can have more fan-outs, has a shorter delay time in the gate and can further reduce the wire delay time between gates than a normal gate. A power gate, however, has more cells than a normal gate with the equivalent logic function and occupies a larger area on LSI and consumes more power. A logic synthesis section uses a power gate only when the driving ability is insufficient with a normal gate.

The propagation time from flip-flop F3 to flip-flop F4 with a power gate incorporated comprises 4 ns from flip-flop F3 to gate G3 (same as the time from flip-flop F1 to gate G1), 2 ns from gate G3 to gate G4 including wire delay time between blocks with a power gate (1 ns (presumption) for gate delay time at gate G3 plus 1 ns of (B) above), and 4 ns from gate G4 to flip-flop F4 (same as the time from flip-flop F1 to gate G1). Then, the total is 10 ns, which satisfies the condition of (C) above.

If the normal gate above is used in place of the power gate as gate G3, the propagation time from the assumed gate G1 to gate G4 becomes 2.6 ns and the propagation time between flip-flop F3 and flip-flop F4 becomes 10.6 ns, which does not satisfy the condition of (C) above.

Therefore, in the stage of logic synthesis, if gate G3 is a normal gate, the predetermined delay time cannot be satisfied. In such case, the logic synthesis section 40 changes the normal gate to a power gate for delay time adjustment so as to have the delay time satisfy the condition.

Referring now to FIG. 5, an example of wiring delay adjustment when the hierarchical block connection has fan-outs is described.

Firstly, the signal propagation path from flip-flop F5 to flip-flop F6 is described.

Suppose the signal propagation time from flip-flop F5 to gate G5 is 4 ns, the time from gate G5 to gate G6 is 3.8 ns and the time from gate G6 to flip-flop F6 is 2 ns. The total is 9.8 ns, which satisfies the condition of (C) above. The output signal from gate G5 fan outs to gates G6, G7 and G8 thereafter. In such a case, due to the capacitance at the gates on the fan-out side, the signal propagation becomes slower than the case without any fan-out.

Then, the signal propagation path from flip-flop F8 to flip-flop F7 is described..

In addition to the delay at the wire between blocks 1 and 3, the capacitance at the wiring further lowers the signal propagation rate to the fan-out side, and a power gate is required for signal propagation between blocks 1 and 3. As a result, if the propagation time between gate G9 using a power gate and gate G10 is supposed to be 4 ns, when summed with 4 ns from flip-flop F8 to gate G9 and 2 ns from gate G10 to flip-flop F7, the signal propagation time between flip-flop F8 and flip-flop F7 is 10 ns, which satisfies the condition (C) above.

If a normal gate is used in place of the power gate as G9, the propagation time from the assumed gate G5 to gate G10 at block 3 is 4.6 ns. As a result, the propagation time from flip-flop F8 to flip-flop F7 becomes 10.6 ns, which does not satisfy the condition (C) above. In this case, during the logic synthesis processing, the logic synthesis section 40 recognizes that adoption of a normal gate for gate G3 results in dissatisfaction of predetermined delay time and changes the normal gate to a power gate for delay time adjustment so that the delay time satisfies the condition as described above.

Referring next to FIG. 6, an example of minimum delay adjustment (the delay time is adjusted to a value not less than the lower limit of condition) is described below.

Firstly, the signal propagation path from flip-flop F9 to flip-flop F10 is described.

When it is supposed that the signal propagation time from flip-flop F9 to gate G11 is 4 ns and the propagation time from gate G11 to gate G12 is 1.2 ns, and the time from gate G12 to flip-flop F10 is 4.8 ns, then the total is 10 ns, which satisfies the condition of (C) above.

Then, the signal propagation path from flip-flop F11 to flip-flop F12 is described.

In this signal propagation path, the minimum delay compensation is made with delay gates D1 and D2.

A delay gate here is a gate used for extension of signal propagation time in order to adjust the delay time (without any logic function). A delay gate in this embodiment has a signal propagation delay time of 0.2 ns.

By inserting two such delay gates, the propagation time between gates G13 and G14 becomes 0.8 ns. When summed with 4 ns from flip-flop F11 to gate G13 and 4.8 ns from gate G14 to flip-flop F12, the signal propagation time from flip-flop F11 to flip-flop F12 becomes 9.6 ns, which satisfies the condition (C) above.

If no delay gate is inserted between gates G13 and G14, then the signal propagation time between gates G13 and G14 is 0.4 ns. As a result, the propagation time from flip-flop F11 to the flip-flop F12 is 9.2 ns, which does not satisfy the minimum condition (lower limit) of (C) above, which is 9.6 ns.

In this case, during logic synthesis stage, the logic synthesis section 40 recognizes that the predetermined delay time cannot be satisfied without any delay gate and adds and inserts delay gates to adjust the delay time so that the delay time condition can be satisfied as described above.

Figure 7:
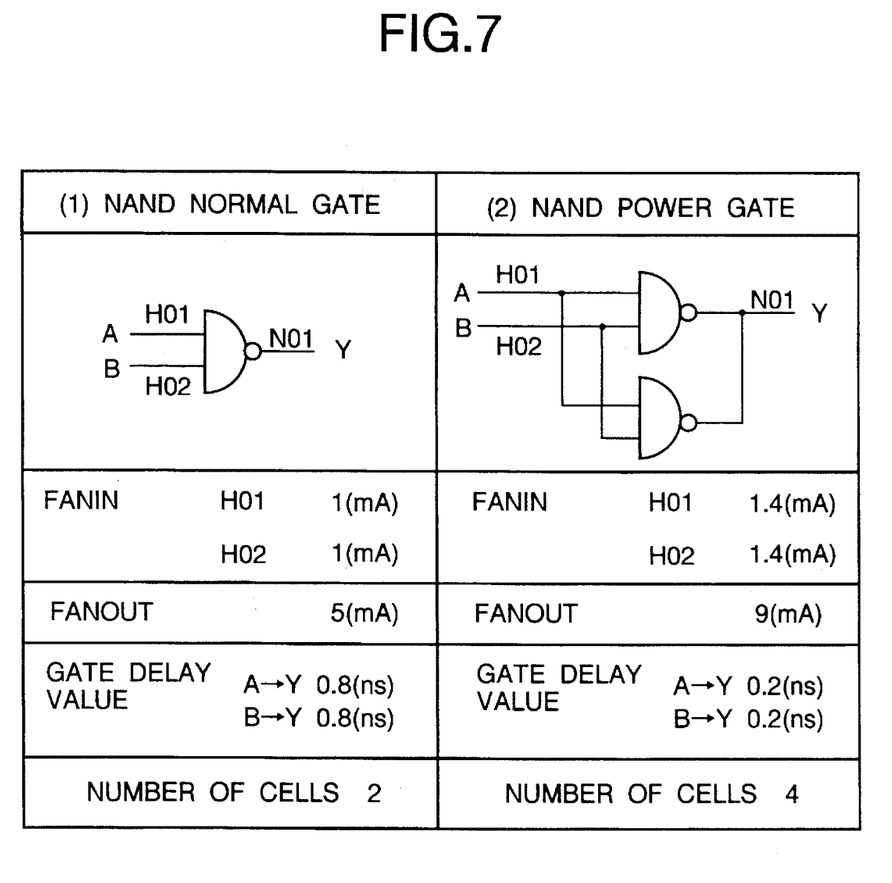
FIG. 7 is a diagram to show configuration examples of a normal gate and a power gate.

FIG. 7 compares a normal gate and a power gate taking examples of NAND. As understood from the figure, a power gate can have more fan-outs, and has a smaller gate delay value and a higher gate driving capacity than a normal gate.

On the other hand, it has drawbacks which are high fan-in values, a large number of cells, higher power consumption and a larger gate area. Therefore, the smaller the number of power gates among the gates constituting an LSI, the more excellent the logic synthesis result is.

As described above, according to the logic synthesis method of the present invention, reference to the placement information of the blocks constituting an LSI enables automatic calculation of the length for the wire over the blocks at the logic synthesis section (program). Thus, the delay time adjustment including wiring delay between the blocks can be made correctly corresponding to the wire length without any human intervention, which reduces manual manhours and shortens the designing period.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A logic synthesis device for LSI comprising:

a logic description information file for storing, for said LSI having a configuration with a plurality of hierarchical blocks given through hierarchical design, logic description information in a certain design description language describing logic operation contents of said LSI for each of said hierarchical blocks;

a block placement information file for storing information about location and area on LSI of the hierarchical blocks constituting said LSI;

a library file for storing the correspondence information between the logic operation contents described in said logic description information and the logic gate circuits physically realized on said LSI; and logic synthesis means for making logic synthesis in each of said hierarchical blocks and between said hierarchical blocks based on said logic description information and said correspondence information and adjusting the delay time between said hierarchical blocks based on said block placement information.

2. A logic synthesis device for LSI as set forth in claim 1, wherein said logic synthesis means further comprises means for performing said logic synthesis using said block placement information and said correspondence information for each of said hierarchical blocks; and delay adjustment means for adjusting the delay time between said hierarchical blocks by considering the distance between said hierarchical blocks obtained from said block placement information so that the delay time between said hierarchical blocks satisfies a predetermined delay time as a condition.

3. A logic synthesis device for LSI as set forth in claim 2, wherein said logic synthesis means further comprises judgment means for judging whether the delay time between said blocks as a result of said delay time adjustment satisfies the predetermined delay time.

4. A logic synthesis device for LSI as set forth in claim 2, wherein said delay adjustment means of said logic synthesis means changes, deletes or adds logic gate circuit(s) of said hierarchical block where said logic synthesis is executed so that the delay time between said hierarchical blocks satisfy the predetermined delay time.

5. A logic synthesis circuit for LSI as set forth in claim 1, wherein said logic synthesis means further comprises means for performing said logic synthesis using said block placement information and said correspondence information for each of said hierarchical blocks; and judgment means for judging whether said each of said hierarchical blocks where said logic synthesis is made can be settled within the area specified in said block placement information.

6. A logic synthesis circuit for LSI as set forth in claim 1, wherein said block placement information file stores, as the information about location and area on LSI of the hierarchical blocks constituting the LSI, values on two-dimensional coordinates with two reference axes intersection at right angles to indicate a location on LSI of vertexes of a quadrilateral, which is a shape of an individual hierarchical block.

7. A logic synthesis device for LSI comprising:

a logic description information file for storing, for said LSI having a configuration with a plurality of hierarchical blocks given through hierarchical design, logic description information in a certain design description language describing logic operation contents of said LSI for each of said hierarchical blocks;

a block placement information file which stores information about location and area on LSI of the hierarchical blocks constituting said LSI;

a library which stores correspondence information between the logic operation contents described in said logic description information and the logic gate circuits physically realized on said LSI; and logic synthesis means for performing logic synthesis in each of said hierarchical blocks and between said hierarchical blocks based on said logic description information and said correspondence information and adjusting the delay time between said hierarchical blocks based on said block placement information;

wherein said logic synthesis means further comprising means for performing said logic synthesis based on said block placement information and said correspondence information for each of said hierarchical blocks;

judgment means for judging whether said each of said hierarchical blocks where said logic synthesis is made can be settled within the area specified in said block placement information; and delay adjustment means for adjusting the delay time between said hierarchical blocks with considering a distance between said hierarchical blocks obtained from said block placement information.

8. A logic synthesis device for LSI as set forth in claim 7, wherein said delay adjustment means of said logic synthesis means changes, deletes or adds logic gate circuit(s) of said each of said hierarchical block where said logic synthesis is executed so that the delay time between said hierarchical blocks satisfies the predetermined delay time.

9. A logic synthesis device for LSI as set forth in claim 8, wherein said logic synthesis means further comprises judgment means to judge whether the delay time between said hierarchical blocks as a result of said delay time adjustment satisfies the predetermined delay time as condition.

10. A logic synthesis device for LSI as set forth in claim 7, wherein said LSI block placement information file stores, as the information about location and area on LSI of the hierarchical blocks constituting the LSI, values on two-dimensional coordinates with two reference axes intersecting at right angles to show a location on LSI of vertexes of a quadrilateral, which is a shape of an individual hierarchical block.

11. A logic synthesis method for LSI having a configuration divided into a plurality of hierarchical blocks specified by hierarchical design, logic description information in a certain design description language describing the logic operation contents of said LSI for each of said hierarchical blocks, a block placement information about location and area on LSI of the hierarchical blocks constituting said LSI and correspondence information between logic operation contents described in said logic description information and the logic gate circuits physically realized on said LSI, comprising the steps of:

a logic synthesis step of performing logic synthesis in each of said hierarchical blocks and between said hierarchical blocks for each of said hierarchical blocks based on said logic description information and said correspondence information; and an adjustment step of making adjustment so that a delay time between said hierarchical blocks satisfies the delay time predetermined as conditions with considering the distance between said hierarchical blocks obtained from said block placement information.

12. A logic synthesis method for LSI as set forth in claim 11, wherein further comprising the step of:

judging whether said each of said hierarchical blocks where said logic synthesis is executed can be settled within the area specified in said block placement information.

13. A logic synthesis method for LSI as set forth in claim 11, wherein said delay time adjustment step changes, deletes or adds logic gate circuit(s) for said each of said hierarchical blocks where said logic synthesis is executed so that the delay time between said hierarchical blocks satisfies the predetermined delay time as a condition.

14. A logic synthesis method for LSI as set forth in claim 11, further comprising a step to judge whether the delay time between said hierarchical blocks as a result of said delay time adjustment satisfies said predetermined delay time as a condition.

* * * * *